US007062735B2

(12) United States Patent
Shim

(10) Patent No.: US 7,062,735 B2
(45) Date of Patent: Jun. 13, 2006

(54) CLOCK EDGE VALUE CALCULATION IN HARDWARE SIMULATION

(75) Inventor: Hyeonjoon Shim, Fremont, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 174 days.

(21) Appl. No.: 10/336,124

(22) Filed: Jan. 3, 2003

(65) Prior Publication Data

US 2004/0133866 A1    Jul. 8, 2004

(51) Int. Cl.
*G06F 17/50* (2006.01)

(52) U.S. Cl. .............................. 716/6; 716/5
(58) Field of Classification Search ............... 716/1–6, 716/16–18
See application file for complete search history.

(56) References Cited

U.S. PATENT DOCUMENTS 5,222,230 A * 6/1993 Gill et al. .................. 713/600
5,912,820 A * 6/1999 Kerzman et al. ............... 716/6
6,408,265 B1 * 6/2002 Schultz et al. ................ 703/22
6,457,167 B1 * 9/2002 Kitahara ...................... 716/18
6,615,397 B1 * 9/2003 Andreev et al. ............... 716/6
6,654,935 B1 * 11/2003 Ara et al. ..................... 716/4
6,928,570 B1 * 8/2005 Fukuda ...................... 713/400
2002/0128812 A1 * 9/2002 Gooding et al. .............. 703/23
2003/0192020 A1 * 10/2003 Collins ......................... 716/6
2004/0015801 A1 * 1/2004 Mielke et al. ................. 716/4
2004/0123259 A1 * 6/2004 You et al. ..................... 716/6

* cited by examiner

*Primary Examiner*—Vuthe Siek
*Assistant Examiner*—Binh Tat
(74) *Attorney, Agent, or Firm*—Osha Liang LLP

(57) ABSTRACT

A method for providing a next clock edge value calculation includes obtaining a clock file data, calculating a next clock edge value using the clock file data, and generating an output file using the next clock edge value. A method for providing an nth clock edge value calculation includes obtaining a clock file data and an n value calculating an nth clock edge value using the clock file data and the n value, and generating an output file using the nth clock edge value.

31 Claims, 11 Drawing Sheets

CLOCK EDGE VALUE CALCULATION IN HARDWARE SIMULATION

BACKGROUND OF INVENTION

Modern high performance microprocessors have an ever-increasing number of circuit elements and an ever-rising clock frequency. Also, as the number of circuits that can be used in a central processing unit (CPU) has increased, the number of parallel operations has risen. Examples of efforts to create more parallel operations include increased pipeline depth and an increase in the number of functional units in super-scalar and very-long-instruction-word architectures. As CPU performance continues to increase, the result has been a larger number of circuits switching at faster rates. Thus, from a design perspective, important considerations such as the time needed to complete a simulation and the time needed to debug a CPU design is taken into account.

As a result, high performance, massively parallel processed environments are used to perform CPU design simulation. FIG. 1 shows a block diagram of a typical computer system (100) used to control and monitor execution of a CPU design simulation. A host computer (114), with associated data store (105), controls the simulation of the CPU design that executes on a simulation hardware (116).

The host computer (114) includes such hardware and software mechanisms as are needed to manage simulation, e.g., loading execution processor code onto a processor array, transferring test interface files, transferring design symbol files, etc. The data store (105) may contain several kinds of data including hardware definition source code files, clock file data, test interface files, programmable input files, circuit "object" files, design symbol information (or design database), etc. A general purpose computer (112) with a human interface (110), such as a GUI or a command line interface, together with the host computer (114) support common functions of the simulation environment. A simulation control program (118) executes on the host computer (114) and interacts with the simulation hardware (116) via a test interface (120). The test interface (120) facilitates data transfer between the host computer (114) and the simulation hardware (116).

The simulation control program (118) controls and monitors simulations executing on the simulation hardware (116). The simulation control program (118) also allows a user to interact with the simulation (and the simulation hardware (116)) between complete simulation cycles. The simulation control program (118) supports important functions of the simulation environment (100), including interactive display and modification of the simulation state, setting of execution breakpoints based on simulation times and states, use of test vector files and trace files, use of hardware definition language (HDL) modules that execute on the host computer (114) and are called from the simulation hardware (116), check pointing and restoration of running simulations, the generation of value change dump (VCD) files compatible with waveform analysis tools, and tracing the origin of bad signal states using backtracking techniques.

The test interface (120) supports the visibility into simulations running on the simulation hardware (116) by applying user-defined input stimuli to selected nodes in the running simulation. The output of the user-defined stimuli may be recorded as a trace of specific signals in the simulation and viewed using post-simulation analysis programs. Alternatively, the output of the user-defined stimuli may be compared to expected output values for signals in the design.

The computer system (100) for a simulation environment, as shown in FIG. 1, may be event-driven or cycle-based. Event-driven simulations propagate a change in state from one set of circuit elements to another. Event-driven simulators record relative timing information of the change in state so that timing and functional correctness may be verified. Cycle-based simulations also simulate a change in state from one set of circuit elements to another. Cycle-based simulators, however, evaluate the state of the system once, at the end of each clock cycle. A simulation cycle begins with one or more simultaneous clock edges and completes when every dependent events has completed evaluation. Cycle-based simulators abstract away the timing details for all transactions that do not occur on a cycle boundary. While specific intra-cycle timing information is not available, simulation speed is improved.

The simulation of a CPU design may execute on the simulation hardware (116), which is specifically designed for cycle-based computation (such as PHASER™), or on any appropriate computer, such as a SPARC™ workstation produced by Sun Microsystems, Inc. PHASER™ is specialized hardware developed by Sun Microsystems, Inc. for performing cycle-based computations in a massively parallel, cycle-based computing system. The system uses an array of execution processors arranged to perform cycle-based computations. One example of cycle-based computation is simulation of a cycle-based design written in a computer readable language, such as HDL (e.g., Verilog, etc.), or a high-level language (e.g., Occam, Modula, C, etc.).

Prior to executing on the simulation hardware (116), the cycle-based computation is verified for accuracy and then compiled. During compilation, the compiler decomposes a verified cycle-based computation into execution processor code that may be executed in parallel on a processor array of the simulation hardware (116) by one or more execution processors. The compiler also produces routing tables and other information, such as routing processor code, control code and a design symbol file. The design symbol file involves recording physical locations where the values of nets and registers have been stored, so that test interface (120) and routines called by the simulation control program (118) may access values of nets and registers. Input files, e.g., test interface files provide functionality for items such as trace vectors that typically contain test input data and expected outputs for debugging.

The computer systems described above are for purposes of example only. One or more embodiments of the invention may be implemented on any type of computer system or programming or processing environment.

Debugging design problems directly on the simulation hardware (116) is generally avoided because of the required input/output (I/O) communication between the simulation hardware (116) and the simulation control program (118) (executed on the host computer (114)). Given the rapid execution speed and the high contention for access of the simulation hardware (116) versus the comparably slow execution speed of the host computer (114), simulation performance is impacted when debugging is performed on the simulation hardware (116).

Thus, a common approach for debugging a large and complex CPU circuit design is to use the simulation control program (118) to debug the circuit design following the actual simulation of the design. During the simulation of the circuit design on the high performance simulation hardware (116), files are written that contain value-changes for every node in the design (or a portion of the design) of the circuit. The size of the files are generally large, but may be reduced if the value-changes are maintained only at the change of a cycle of the CPU, e.g., a cycle-based simulation. Additionally, during a cycle-based simulation, the host computer (114) only interacts with the simulation hardware (116) between cycles to minimize the effect of the I/O communication on performance. As a trade-off, because the timing details for all transactions that do not occur on a cycle boundary are abstracted away in the cycle-based simulation, specific intra-cycle timing information, i.e., certain clock edge values, are not available (e.g., for TVI (test vector interface), information of value change dumps are recorded without clock edge values in order to save storage and time). To fully and effectively debug a circuit design, such clock edge values need to be re-created. Moreover, most output file formats of TVI such as Verilog's VCD file format or the SST format used by Signalscan (a product of Design Acceleration, Inc.) require clock edge values.

SUMMARY OF INVENTION

In general, in one aspect, the invention comprises a method for providing a next clock edge calculation. The method comprises obtaining a clock file data, calculating a next clock edge value using the clock file data, and generating an output file using the next clock edge value.

In general, in one aspect, the invention comprises a method for providing an nth clock edge value calculation. The method comprises obtaining a clock file data and an n value, calculating an nth clock edge value using the clock file data and the n value, and generating an output file using the nth clock edge value.

In general, in one aspect, the invention comprises a method for providing a clock edge value calculation. The method comprises obtaining a clock file data and an n value, calculating a next clock edge value using the clock file data, calculating an nth clock edge value using the clock file data and the n value, and generating an output file using the next clock edge value and the nth clock edge value.

In general, in one aspect, the invention comprises a computer system for debugging a circuit design. The method comprises a host computer operatively connected to a simulation hardware, a simulation control program executing on the host computer receiving a clock file data for the circuit design, and a data store storing an output file generated by obtaining the clock file data, and calculating a next clock edge value using the clock file data.

In general, in one aspect, the invention comprises a computer system for debugging a circuit design. The method comprises a host computer operatively connected to a simulation hardware, a simulation control program executing on the host computer receiving a clock file data for the circuit design, and a data store storing an output file generated by obtaining the clock file data and an n value and calculating an nth clock edge value using the clock file data and the n value.

In general, in one aspect, the invention comprises an apparatus for providing a next clock edge value calculation. The apparatus comprises means for obtaining a clock file data, means for calculating a next clock edge value using the clock file data, and means for generating an output file using the next clock edge value.

In general, in one aspect, the invention comprises an apparatus for providing an nth clock edge value calculation. The apparatus comprises means for obtaining a clock file data and an n value, means for calculating an nth clock edge value using the clock file data and the n value, and means for generating an output file using the nth clock edge value.

Other aspects and advantages of the invention will be apparent from the following description and the appended claims.

DETAILED DESCRIPTION

Figure 1:
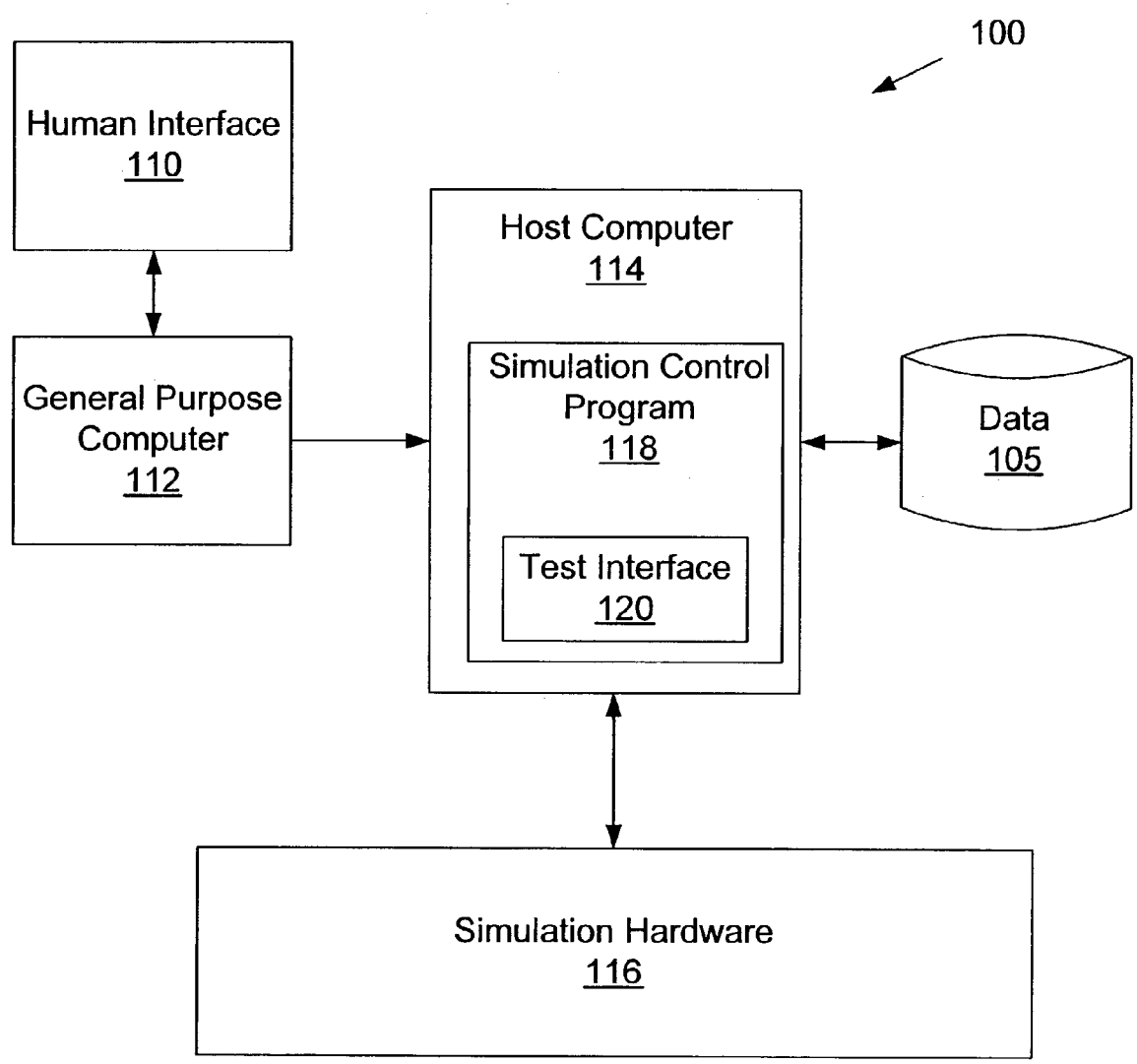
FIG. 1 shows a typical computer system for CPU design simulation.

The present invention relates to a method and apparatus for providing clock edge value calculations given clock file data. The present invention further relates to generating an output file using the clock edge value calculation. Specific embodiments of the invention will now be described in detail with reference to the accompanying figures. Like elements in the various figures are denoted by like reference numerals for consistency.

In the following detailed description of the invention, numerous specific details are set forth in order to provide a more thorough understanding of the invention. However, it will be apparent to one of ordinary skill in the art that the invention may be practiced without these specific details. In other instances, well-known features have not been described in detail to avoid obscuring the invention.

Figure 2:
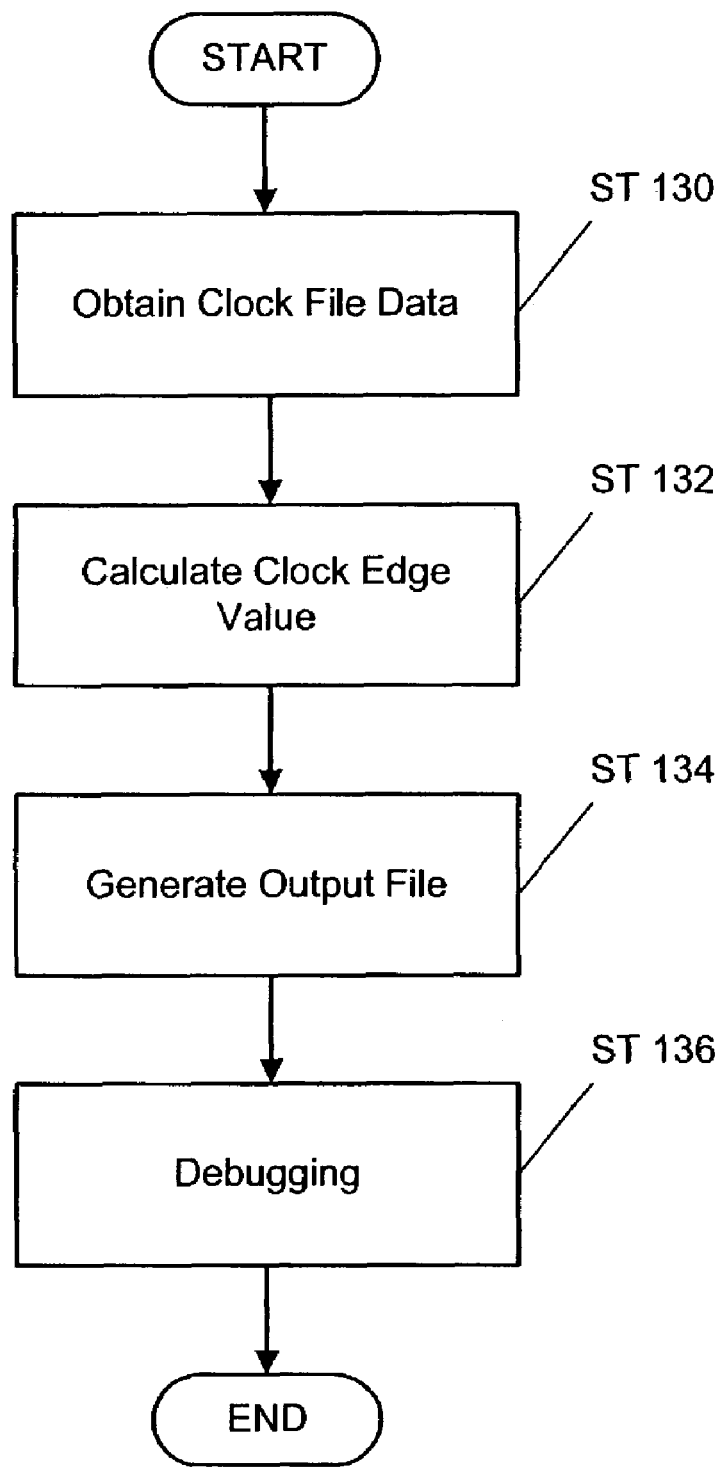
FIG. 2 shows a flow chart for providing a clock edge value for a circuit design simulation in accordance with one or more embodiments of the invention.

In one or more embodiments of the invention, FIG. 2 shows a flow chart for providing a clock edge value for a circuit design simulation. While a circuit design simulation is used as an example of a use of calculating a clock edge value, one skilled in the art will appreciate that this method could be used in any situations when the clock edge values should be calculated. Initially, clock file data is obtained (Step 130). Referring back to FIG. 1, the clock file data is generally stored as a part of a design symbol file in the data store (105) associated with the host computer (114). The clock file data includes values transferred from the simulation hardware (116) via the test interface (120). The clock file data generally includes periodic clock values such as a rising (or positive) clock edge value, a falling (or negative) clock edge value, and a period value. However, the clock file data may also include non-periodic clock values, such as a constant clock value and a reset clock value.

While this method specifically mentions a clock file data, the clock data should not be limited to a particular form of the data. The method can be performed using any form of clock edge information as long as a rising edge, a falling edge, and period values can be inferred, i.e., the clock file data should not be limited to a file or specific representation format of the rising edge, the falling edge, and the period. However, in one or more embodiments of the invention, the most effective form of the clock file data is a clock file data in the form of an ASCII file.

Figure 3:
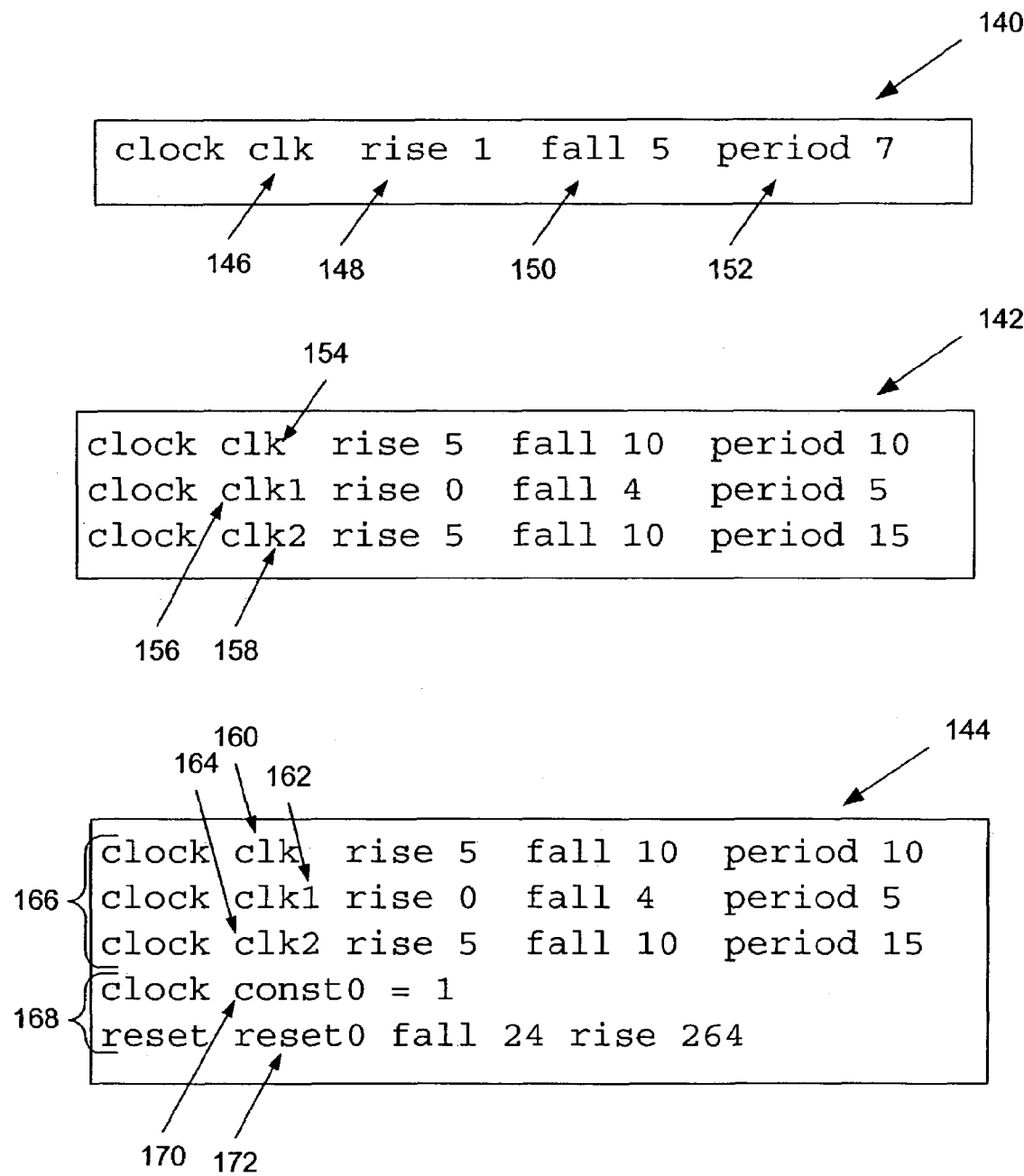
FIG. 3 shows a representation of clock file data accordance with one or more embodiments of the invention.

Referring to FIG. 3, in accordance with one or more embodiments of the invention, clock file data may be represented as a text (or ASCII) file. The text file may be a file (140) with a single periodic clock, a file (142) with multiple periodic clocks, or a file (144) with multiple periodic clocks (166) and multiple non-periodic clocks (168). Within each clock file, data is represented using a label for each clock (146, 154, 156, 158, 160, 162, 164, 170, 172), a rise value (148), a fall value (150), and a period value (152).

Referring back to FIG. 2, the clock file data is used to calculate a clock edge value (Step 132). The method used to calculate the clock edge value varies depending on the input available to determine the value (e.g., both edges, any edge, etc.) and the desired output (e.g., next edge value, a specific ("nth") clock edge value, both a next edge value and a nth edge value, etc.). Six different methods to calculate a clock edge value are discussed and shown below (using FIGS. 4–11), however, these methods are exemplary and not mean to restrict the scope of the claims. Those skill in the art will appreciate that additional methods (e.g., determining a next and/or a nth clock edge value for a single positive edge or a single negative edge) may be used without departing from the spirit of the invention.

Once a specific clock edge value is calculated, an output file is generated (Step 134). Referring back to FIG. 1, the output file may be generated by the test interface component (120) within the simulation control program (118) executing on the host computer (114). The format of the output file may include a flat text (ASCII) file or a hierarchical file structure containing a collection of indexed clock edge values. The output file may also be stored in a proprietary format such as Verilog's VCD file format or the SST format used by Signalscan (a product of Design Acceleration, Inc.).

Depending on the output file generated, a user of the simulation control program is able to debug the circuit design at an early stage in the development cycle. Returning to FIG. 2, in such a circuit design debugging environment, at least two debugging modes may be supported (Step 136), including a signal trace mode and a test vector check mode. The signal trace mode involves using the output file containing the recorded values of signals in the design as a post-simulation analysis file (e.g., an SST file) to be evaluated by waveform viewing and analysis tools. The test vector check mode involves generating the output file (in VCD format) from user-specified input values for signals in the design. The output file is compared to user-specified expected output values (e.g., a golden file) during automated checks for correct results. Both the signal trace mode and the test vector check mode can be toggled on or off, and a particular output file may be selected by the user of the simulation control program.

Figure 4:
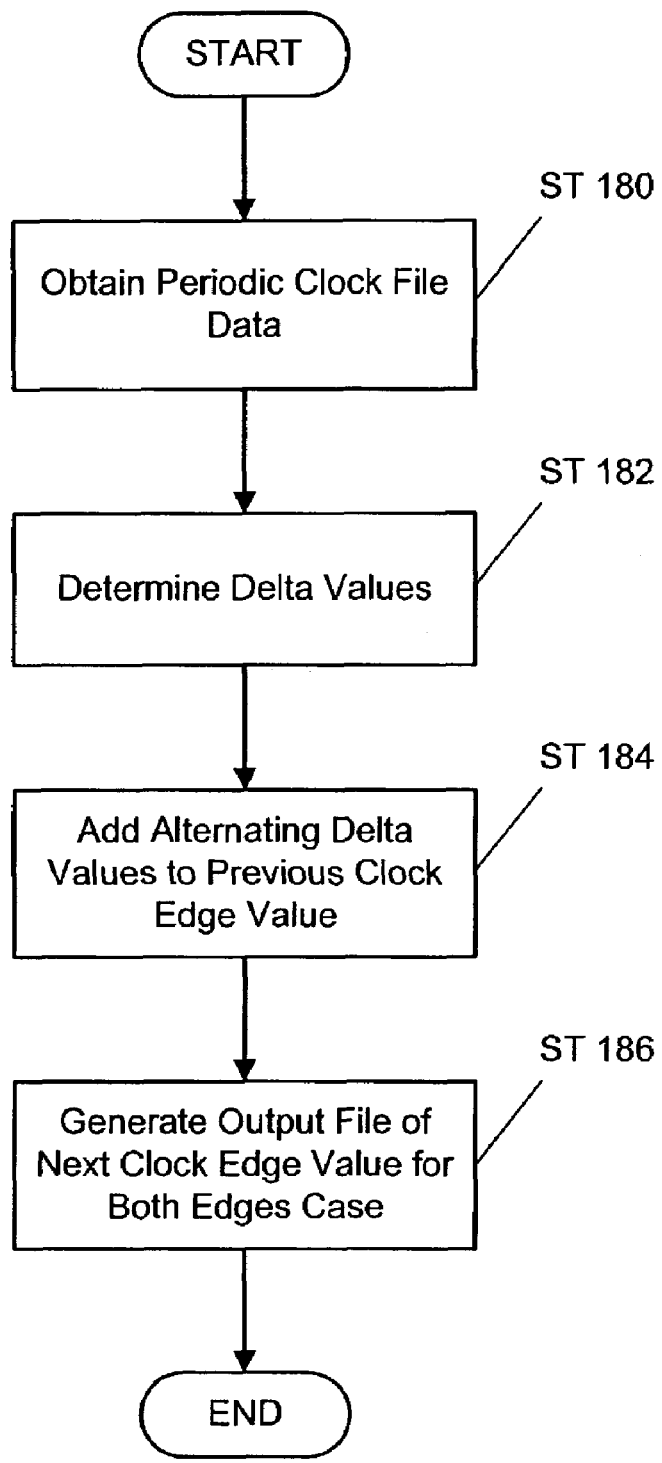
FIG. 4 shows an a flowchart for generating an output file of a next clock edge value for a both edges case in accordance with one or more embodiments of the invention.

As discussed earlier, the method used to calculate a clock edge value varies depending on the input available and the desired output. When the available input is the rising/falling edges (i.e., both edges) of a single clock and the desired output is a next clock edge value, an output file may be generated as shown in FIG. 4. First, the periodic clock file data for a single clock is obtained (Step 180). The clock file includes a rise value, a fall value, and a period value for a single clock (comparable to file (140) in FIG. 3). Using these values, two distinct delta values can be determined (Step 182) using two formulas: (1)f−r; and (2)p−f+r, where f equals the first edge value (e.g., the falling edge value), r equals the second edge value (e.g., the rising edge value), and p equals the period value. To calculate the next clock edge value (Step 184), the two distinct delta values are alternately added to the previous clock edge value. The initial positive clock edge value used for this calculation is obtained by subtracting the delta value from the rising edge value. The initial negative clock edge value used for this calculation is obtained by subtracting the delta value from the falling edge value. Once the next clock edge value is calculated, an output file is generated (Step 186) containing the value of the next clock edge for the both edges case.

Figure 5:
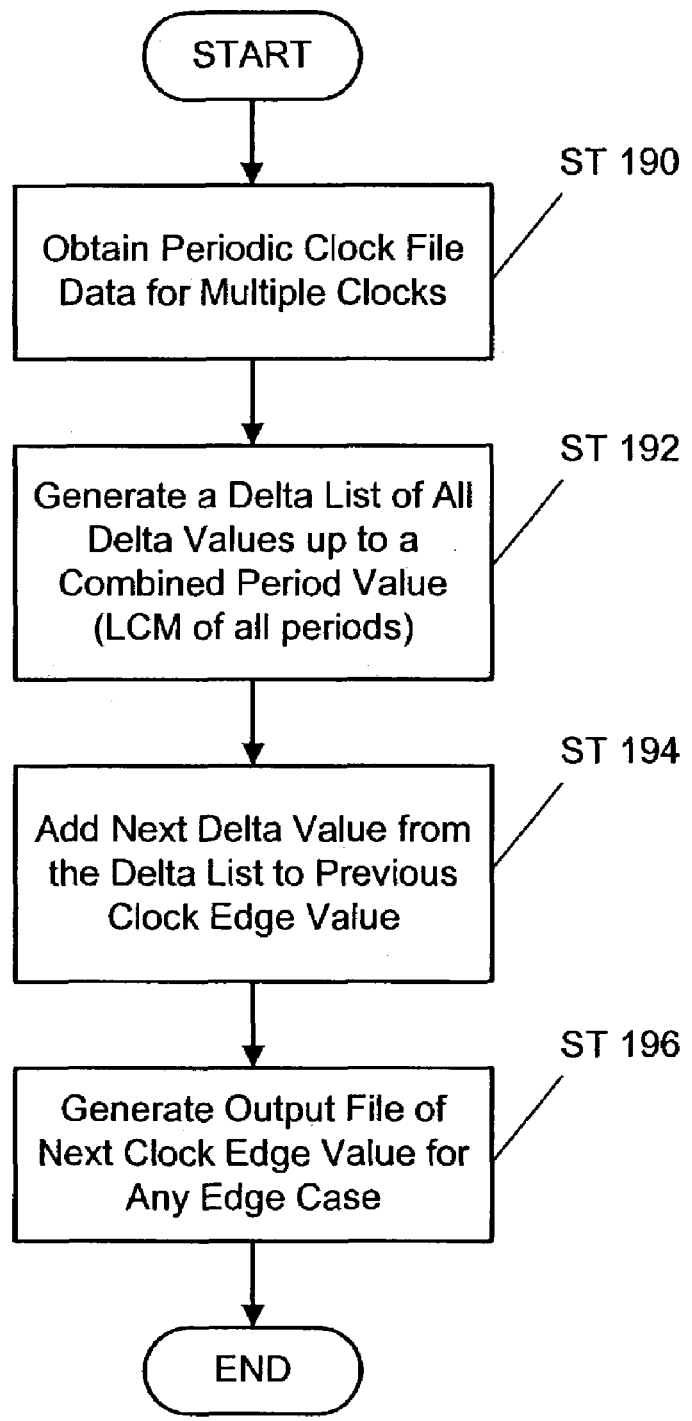
FIG. 5 shows a flowchart for generating an output file of a next clock edge value for an any edge case in accordance with one or more embodiments of the invention.

When the available input is any edges of multiple periodic clocks and the desired output is a next clock edge value, an output file may be generated as shown in FIG. 5. Initially, a periodic clock file data is obtained for multiple clocks (Step 190). The clock file includes a rise value, a fall value, and a period value for multiple periodic clocks (comparable to file (142) in FIG. 3). Using the values associated with the multiple clocks, a delta list is generated for all delta values up to a combined period value (Step 192).

Figure 6:
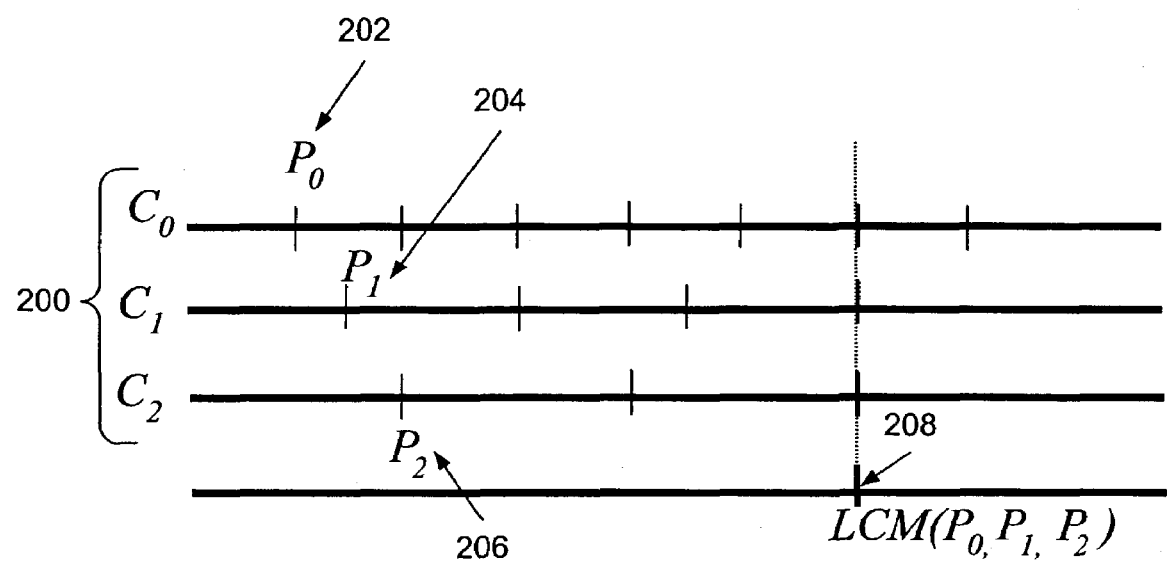
FIG. 6 shows an representation of the least common multiple of periods for multiple clocks in accordance with one or more embodiments of the invention.

The combined period value is defined as the least common multiple of all period values for all clocks. FIG. 6 shows a graphical illustration of determining the combined period value. In this example, the period values for three clocks (200) are evaluated. A period associated with each clock is chosen. Thus, P0 (202), P1 (204), and P2 (206) are chosen. To determine the combined period value, the least common multiple of all three periods is calculated. As observed in FIG. 6, the combined period value is the value (208) where every period value for all clocks are equal.

To generate the delta list, all of the clock edge values for all clocks are organized in ascending order from the lowest clock edge value to the combined period value (i.e., until a clock edge value reaches the LCM of all period values for all clocks) to form a clock edge value line graph. The distance between each clock edge value in the clock edge value line graph is determined and this distance referred to as a delta value. In one or more embodiments of the invention, the calculated delta values are stored in a circular data structure, such as an array, that may be accessed using an index or a pointer to a particular value within the data structure. The delta values are maintained in the data structure in a manner corresponding to the order of the calculated distances between the ascending clock edge values. In the case where the pointer reaches an indexed element of the data structure greater than the total number of clock edge values, the pointer wraps back around to the first element of the data structure. To calculate the next clock edge value, the next delta value (as determined by an indexed location or a pointer to a specific element in the delta list) is added to the previous clock edge value (Step 194). Once the clock edge value is calculated, an output file is generated (Step 196) containing the value of the next clock edge for the any edge case.

Figure 7:
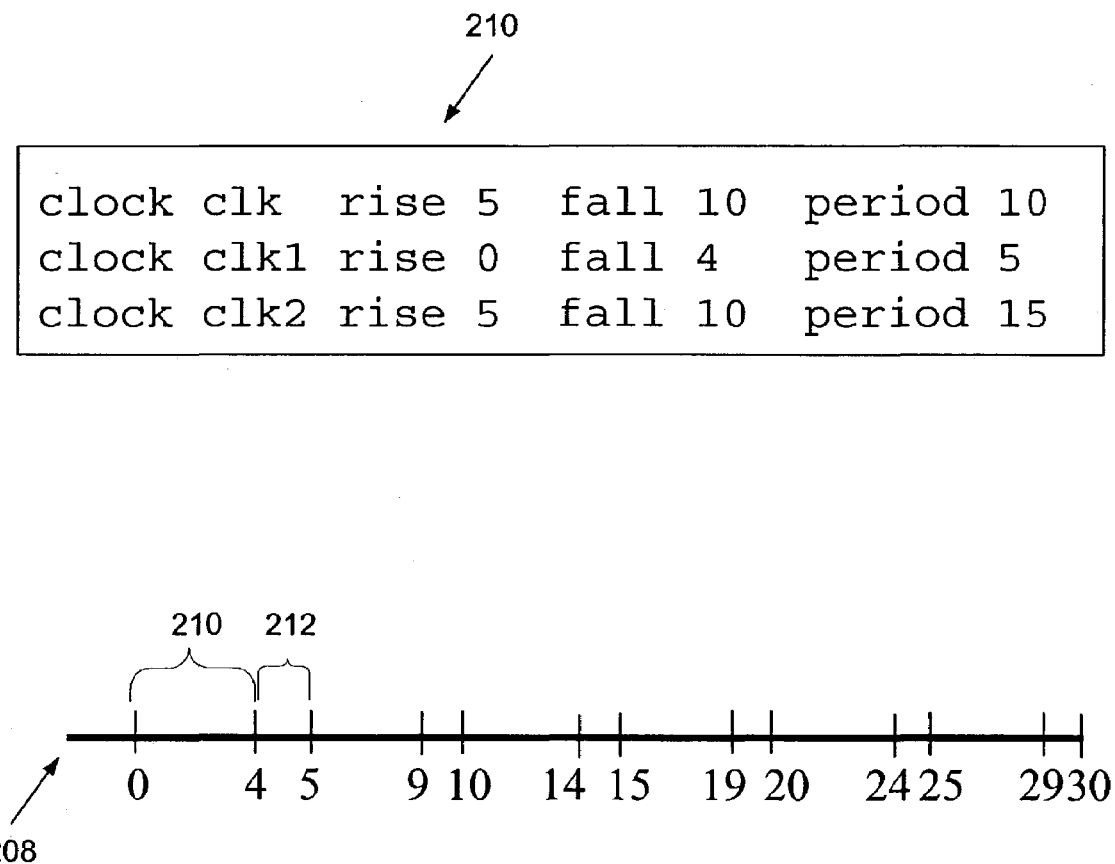
FIG. 7 shows an example of clock file data, a clock edge value line graph, and a delta list array for calculating a next clock edge value for an any edge case in accordance with one or more embodiments of the invention.
Figure 7:
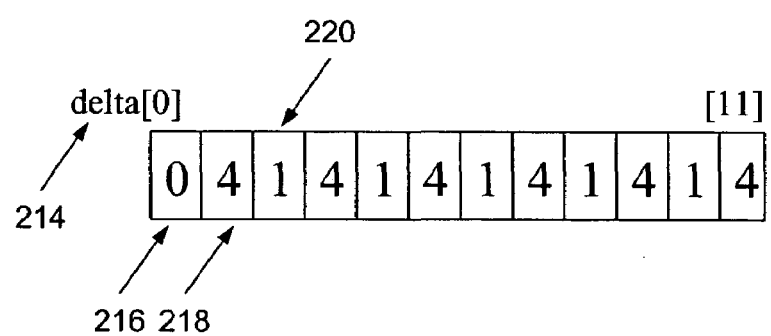

For example, as shown in FIG. 7, clock file data (200) has 3 separate clocks labeled clk, clk1, and clk2, each with a corresponding rise value, fall value, and period value. Using the period values of all three clocks, a combined period value is calculated using the formula: LCM(P1, P2, P3). Applying the period values of all three clocks to the formula results in LCM (5, 10, 15) with the calculation equal to 30. Therefore, applying the data from the clock file (200), the clock edge value line graph (208) starts with the lowest clock edge value of 0 (the rise value of clk1) and ends with the combined period value of 30. The remainder of the clock edge value line graph is completed by plotting the clock edge values for all three clocks using the clock file data (200) until the combined period value of 30 is reached. The completed line graph (208) generated by using data from clock file (200) is shown in FIG. 7.

Using the clock edge value line graph (208), the circular delta list is generated by measuring the distance between the clock edge values (or delta). In FIG. 7, the initial delta value is 0, the next delta value (210) is 4, the third delta value (212) is 1. These delta values are then stored in a circular data structure, such as a delta list array (214). The delta list array (214) is indexed from 0 to 11 with delta[0] corresponding to the initial indexed delta value of 0 (216), with delta[1] corresponding to the second indexed delta value of 4 (218), and with delta[2] corresponding to the third indexed delta value of 1 (220). The total number of indexed delta values equals the total number of clock edge values less than or equal to the combined period value.

Using the data from clock file (210), 12 clock edge values are less than or equal to the combined period value of 30. Therefore, the indexed delta values range from delta[0] to delta[11]. To calculate the next clock edge value using the data from clock file (210), the next delta value (as indicated by the pointer to delta[1]) of 4 (218) is added to the previous clock edge value of 0 (216) resulting in a next clock edge value of 4.

Figure 8:
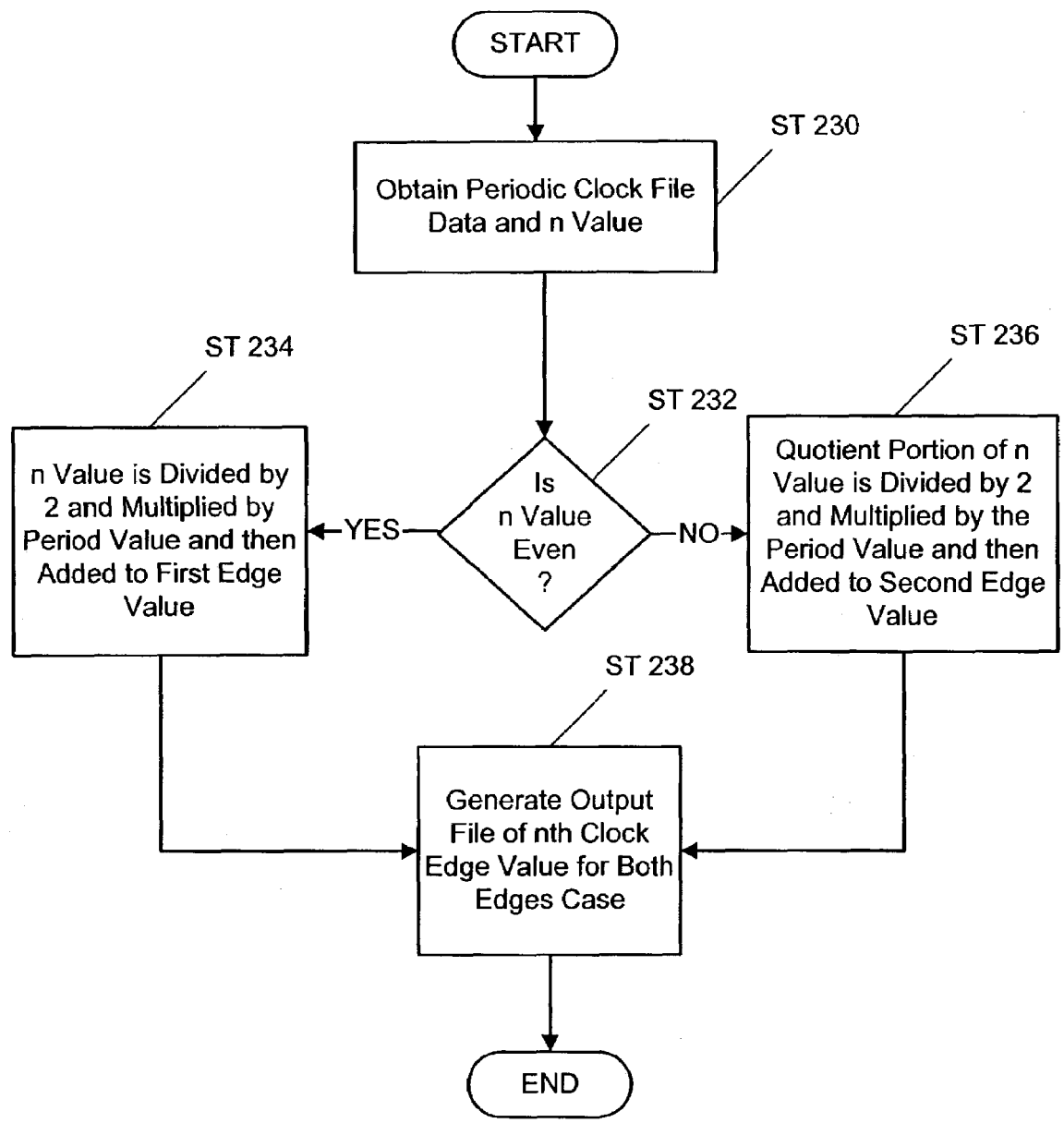
FIG. 8 shows a flowchart for generating an output file of an nth clock edge value for a both edges case in accordance with one or more embodiments of the invention.

When the available input includes the rising/falling edges (i.e., both edges) of a single clock and a specific clock edge value (i.e., an "n" value), and the desired output is a clock edge value corresponding to the n value (i.e., an "nth" clock edge value), an output file may be generated as shown in FIG. 8. First, the periodic clock file data for a single clock and the n value is obtained (Step 230). The clock file includes a rise value, a fall value, and a period value for a single clock (comparable to file (140) in FIG. 3).

If the n value is even (Step 232), the nth clock edge value is calculated (Step 234) using the following formula: (n/2)*P+F, where n equals the n value, P equals the period value, and F equals the first edge value (usually the rising edge value). If the n value is odd (Step 232), the nth clock edge value is calculated (Step 236) using the following formula: Q*P+S, where Q equals the quotient portion of the n value divided by 2, P equals the period value, and s equals the second edge value (usually the falling edge value). Once the nth clock edge value is calculated, an output file is generated (Step 238) containing the value of the nth clock edge for the both edges case.

Figure 9:
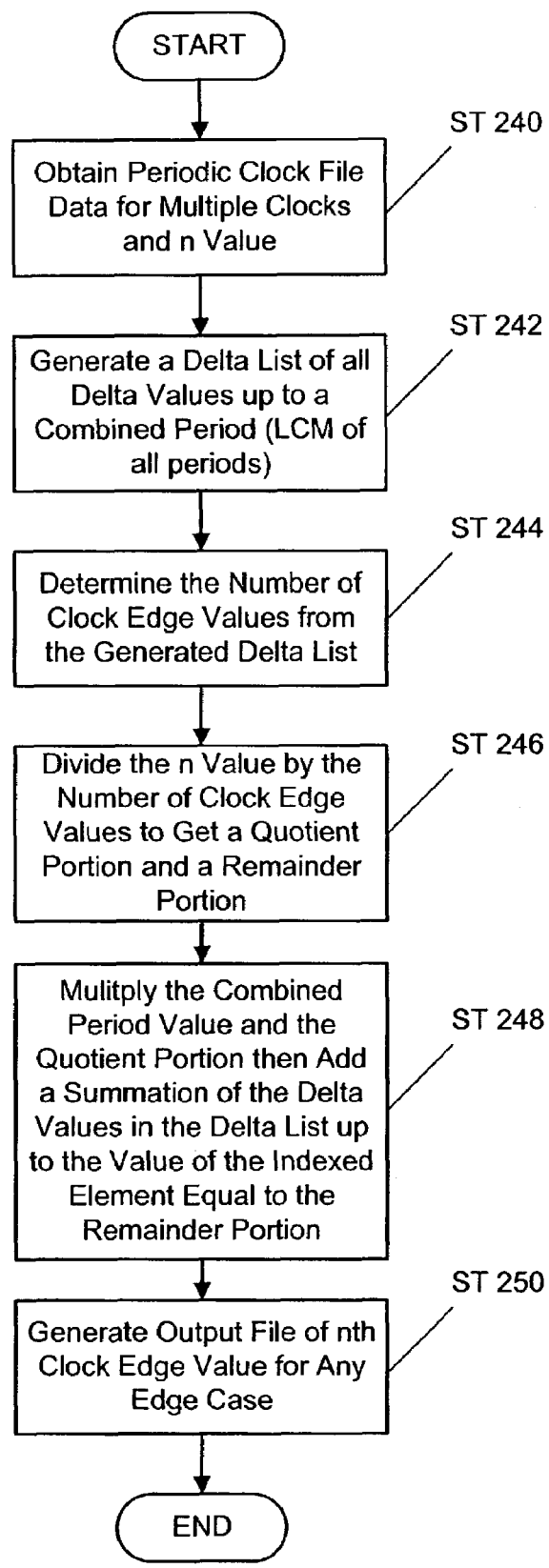
FIG. 9 shows a flowchart for generating an output file of an nth clock edge value for an any edge case in accordance with one or more embodiments of the invention.

When the available input is any edges of multiple periodic clocks and a specific clock edge value (i.e., an "n" value), and the desired output is a clock edge value corresponding to the n value (i.e., an "nth" clock edge value), an output file may be generated as shown in FIG. 9. Initially, a periodic clock file data for multiple clocks and an n value is obtained (Step 240). The clock file includes a rise value, a fall value, and a period value for multiple periodic clocks (comparable to file (142) in FIG. 3). Using the values associated with the multiple (periodic) clocks, a delta list is generated for all delta values up to a combined period value (Step 242), as described above.

To calculate the nth clock edge value, the number of clock edge values is determined by counting the number of clock edge values in the generated delta list up to the combined period value (Step 244). Next, the n value is divided by the number of clock edge values resulting in an answer with a quotient portion and a remainder portion (Step 246). The nth clock edge value is calculated by multiplying the combined period value and the quotient portion then adding a summation of the delta values in the delta list from the first indexed element to the indexed element equal to the remainder portion (Step 248). Once the clock edge value is calculated, an output file is generated (Step 250) containing the value of the nth clock edge value for the any edge case.

Figure 10:
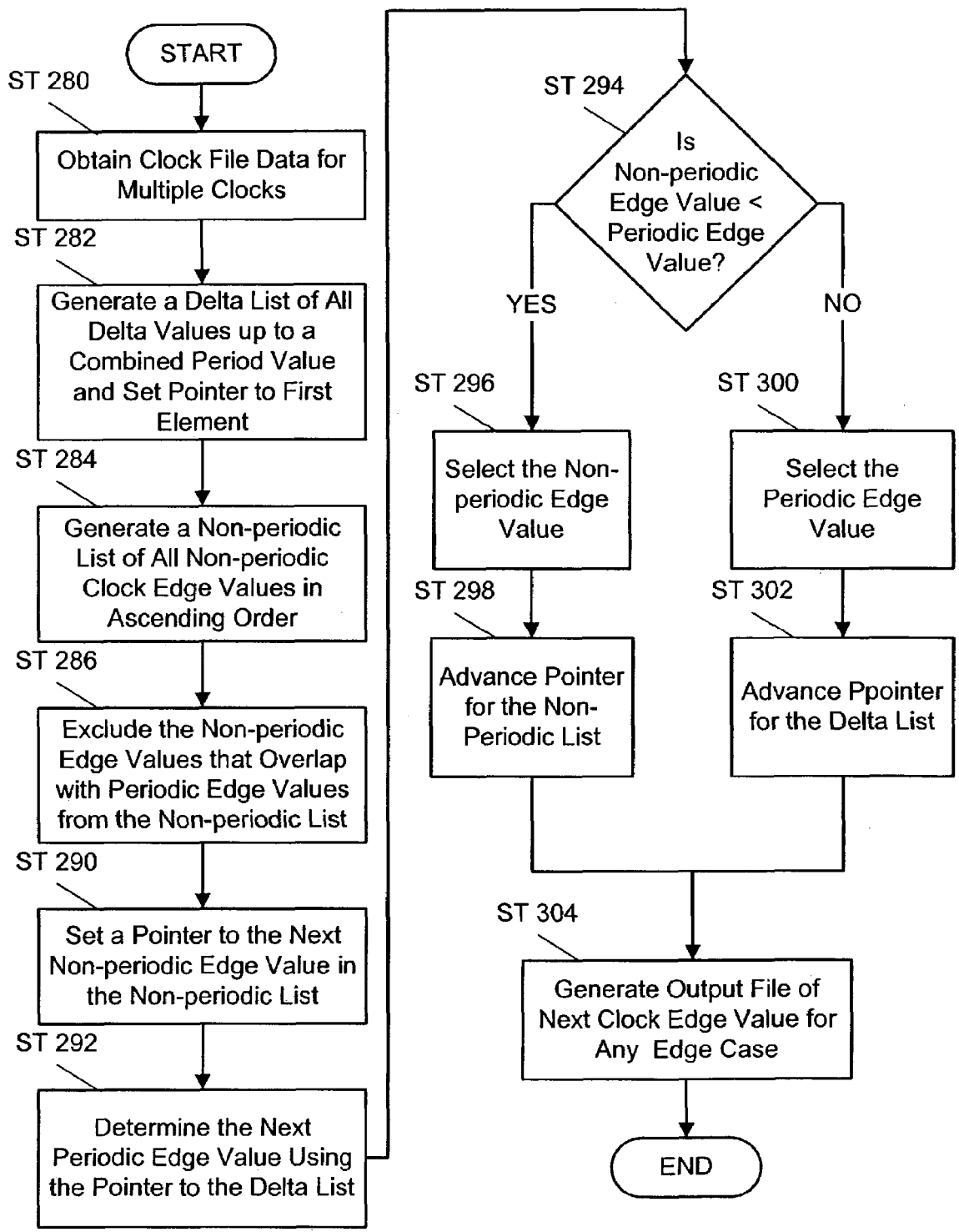
FIG. 10 shows a flowchart for generating an output file of a next clock edge value for an any edge case when non-periodic clocks are involved in accordance with one or more embodiments of the invention.

When the available input is any edges of multiple periodic and non-periodic clocks and the desired output is a next clock edge value, an output file may be generated as shown in FIG. 10. Initially, a clock file data is obtained for multiple clocks (Step 280). The clock file includes a rise value, a fall value, a period value for multiple periodic clocks, a reset clock, and a constant clock (comparable to file (144) in FIG. 3).

Using the values associated with the multiple (periodic) clocks, a delta list may be generated for all delta values up to a combined period value (as described above) and a pointer is set to the first indexed element of the delta list (Step 282). In a similar manner, a non-periodic list is generated for all non-periodic clock edge values in ascending order (Step 284). Upon comparison of the delta list and the non-periodic list, the non-periodic edges that overlap with the periodic edges are excluded from the non-periodic list (Step 286).

A pointer is set to the next non-periodic edge value in the non-periodic list. The next periodic edge value is determined using the pointer to the delta list (Step 292). If the value of the element pointed to in the non-periodic list (i.e., the non-periodic edge value) is less than the value of the element pointed to in delta list (i.e., the periodic edge value) (Step 294), then the non-periodic edge value is selected as the next clock edge value (Step 296) and the pointer for the non-periodic list is advanced (Step 298). Otherwise, the periodic edge value is selected as the next clock edge value (Step 300) and the pointer for the delta list is advanced (Step 302). Once the clock edge value is calculated, an output file is generated (Step 304) containing the value of the next clock edge for the any edge case with periodic and non-periodic clocks.

Figure 11:
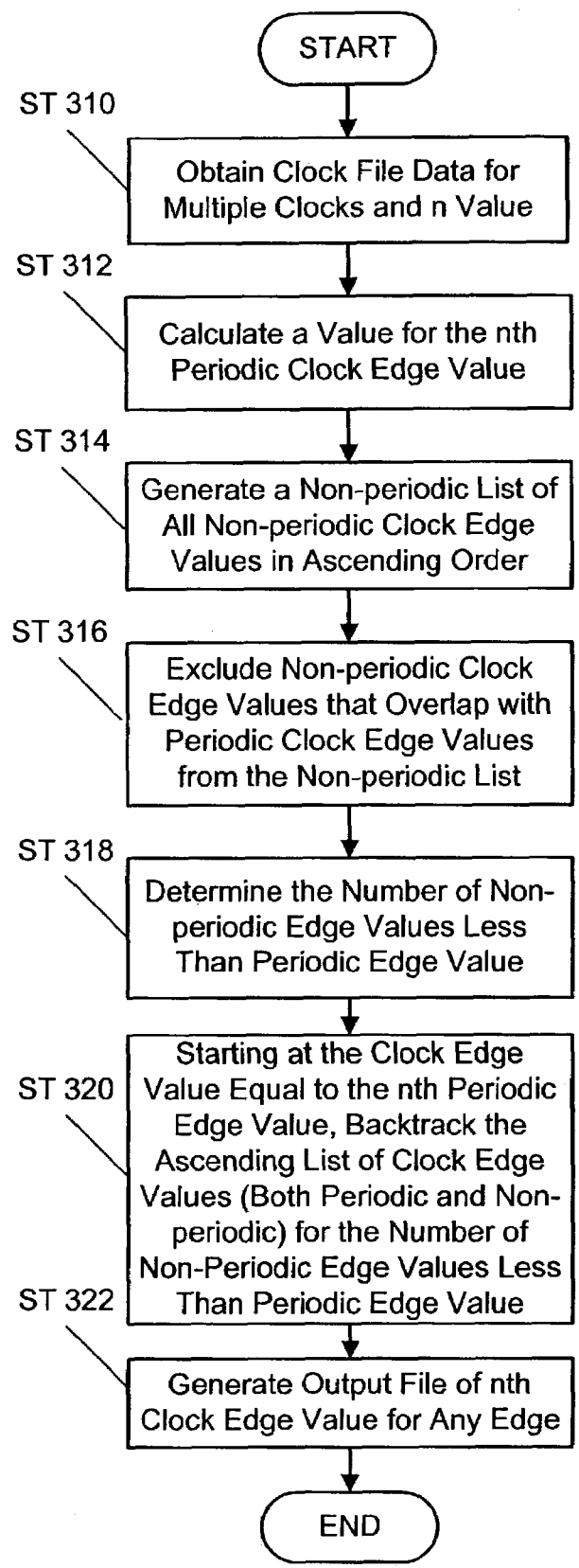
FIG. 11 shows a flowchart for generating an output file of an nth clock edge value for an any edge case when non-periodic clocks are involved in accordance with one or more embodiments of the invention.

When the available input is any edges of multiple periodic and non-periodic clocks and a specific clock edge value (i.e., an "n" value), and the desired output is a clock edge value corresponding to the n value (i.e., an "nth" clock edge value), an output file may be generated as shown in FIG. 11. Initially, a clock file data for multiple clocks and an n value is obtained (Step 310). The clock file includes a rise value, a fall value, a period value for multiple periodic clocks, a reset clock, and a constant clock (comparable to file (144) in FIG. 3).

Using the values associated with the multiple clocks, an nth clock edge value is calculated for the any edge case (as shown in FIG. 9) (Step 312). A non-periodic list is generated for all non-periodic clock edge values, in ascending order (Step 314). Upon comparison of the delta list and the non-periodic list, the non-periodic edges that overlap with the periodic edges are excluded from the non-periodic list (Step 316). The number of non-periodic edges less than the nth periodic edge value calculated in Step 312 is determined (Step 318). Starting at the clock edge value equal to the nth periodic clock edge value, backtrack the ascending list of clock edge values (both periodic and non-periodic) for the number of non-periodic edges less than the periodic edge value (Step 320). Once the clock edge value is calculated, an output file is generated (Step 322) containing the value of the nth clock edge value for the any edge case with periodic and non-periodic clocks.

Advantages of one or more embodiments of the invention may include one or more of the following. In one or more embodiments, the invention provides the ability to effectively and efficiently debug circuit designs on a simulation control program reducing I/O communication with the simulator hardware. Further, the invention provides full debugging functionality on a cycle-based simulation system by re-creating clock edge values abstracted away during compilation of a circuit design. Further, the invention provides calculation of clock edge values in a fast and efficient manner. Those skilled in the art appreciate that the present invention may include other advantages and features.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A method for providing a next clock edge value calculation, comprising:
    obtaining a clock file data, wherein the clock file data comprises a clock label, a rise value, a fall value, and a period value;
    calculating a next clock edge value using the clock file data, wherein calculating the next clock edge value comprises:
        determining a first delta value and a second delta value using the rise value, the fall value, and the period value, and
        alternately adding the first delta value and the second delta value to a previous clock edge value; and
    generating an output file using the next clock edge value.

2. The method of claim 1, further comprising:
    creating the clock file data during compilation of a circuit design.

3. The method of claim 1, further comprising:
    debugging a circuit design using the output file.

4. The method of claim 1, further comprising:
    tracing a value at each clock edge using the output file.

5. The method of claim 4, wherein the output file comprises a post-simulation analysis file.

6. The method of claim 1, further comprising:
    comparing the output file to a golden file.

7. The method of claim 1, wherein the clock file data comprises at least one selected from a group consisting of a periodic clock, a plurality of periodic clocks, and a plurality of periodic clocks and non-periodic clocks.

8. The method of claim 1, wherein calculating the next clock edge value comprises calculating the next clock edge value based on a type of clock information contained in clock file data.

9. A method for providing an nth clock edge value calculation, comprising:
    obtaining a clock file data and an n value, wherein the clock file data comprises a clock label, a rise value, a fall value, and a period value;
    calculating an nth clock edge value using the clock file data and the n value, wherein calculating the nth clock edge value comprises:
        calculating the nth clock edge value using the rise value and the period value, if the n value is even, and
        calculating the nth clock edge value using the fall value and the period value, if the n value is odd; and
    generating an output file using the nth clock edge value.

10. The method of claim 9, further comprising:
    creating the clock file data during compilation of a circuit design.

11. The method of claim 9, further comprising:
    using the output file to perform at least one selected from a group consisting of debugging a circuit design and tracing a value at each clock edge.

12. The method of claim 11, wherein the output file comprises a post-simulation analysis file.

13. The method of claim 9, further comprising:
    comparing the output file to a golden file.

14. The method of claim 9, wherein the clock file data comprises at least one selected from a group consisting of a periodic clock, a plurality of periodic clocks, and a plurality of periodic clocks and non-periodic clocks.

15. The method of claim 9, wherein calculating the nth clock edge value comprises calculating the nth clock edge value based on a type of clock information contained in clock file data.

16. A method for providing a clock edge value calculation, comprising:
    obtaining a clock file data and an n value, wherein the clock file data comprises a clock label, a rise value, a fall value, and a period value;
    calculating a next clock edge value using the clock file data,
    wherein calculating the next clock edge value comprises:
        determining a first delta value and a second delta value using the rise value, the fall value, and the period value, and
        alternately adding the first delta value and the second delta value to a previous clock edge value;
    calculating an nth clock edge value using the clock file data and the n value,
    wherein calculating the nth clock edge value comprises:
        calculating the nth clock edge value using the rise value and the period value, if the n value is even, and
        calculating the nth clock edge value using the fall value and the period value, if the n value is odd; and
    generating an output file using the next clock edge value and the nth clock edge value.

17. The method of claim 16, further comprising:
    creating the clock file data during compilation of a circuit design.

18. The method of claim 16, further comprising:
    using the output file to perform at least one selected from a group consisting of debugging a circuit design and tracing a value at each clock edge.

19. The method of claim 18, wherein the output file comprises a post-simulation analysis file.

20. The method of claim 16, further comprising:
    comparing the output file to a golden file.

21. The method of claim 16, wherein the clock file data comprises at least one selected from a group consisting of a periodic clock, a plurality of periodic clocks, and a plurality of periodic clocks and non-periodic clocks.

22. A computer system for debugging a circuit design, comprising:
- a host computer operatively connected to a simulation hardware;
- a simulation control program executing on the host computer receiving a clock file data for the circuit design; and
- a data store storing an output file generated by:
  - obtaining the clock file data, wherein the clock file data comprises a clock label, a rise value, a fall value, and a period value; and
  - calculating a next clock edge value using the clock file data,
  - wherein calculating the next clock edge value comprises:
    - determining a first delta value and a second delta value using the rise value, the fall value, and the period value; and
    - alternately adding the first delta value and the second delta value to a previous clock edge value.

23. The computer system of claim 22, further comprising: a test interface allowing debugging the circuit design using the output file.

24. The computer system of claim 22, wherein the clock file data is created during compilation of a circuit design.

25. The computer system of claim 22, wherein the clock file data comprises at least one selected from a group consisting of a periodic clock, a plurality of periodic clocks, and a plurality of periodic clocks and non-periodic clocks.

26. A computer system for debugging a circuit design, comprising:
- a host computer operatively connected to a simulation hardware;
- a simulation control program executing on the host computer receiving a clock file data for the circuit design; and
- a data store storing an output file generated by:
  - obtaining the clock file data and an n value, wherein the clock file data comprises a clock label, a rise value, a fall value, and a period value; and
  - calculating an nth clock edge value using the clock file data and the n value,
  - wherein calculating the nth clock edge value comprises:
    - calculating the nth clock edge value using the rise value and the period value, if the n value is even, and
    - calculating the nth clock edge value using the fall value and the period value, if the n value is odd.

27. The computer system of claim 26, further comprising: a test interface allowing debugging the circuit design using the output file.

28. The computer system of claim 26, wherein the clock file data is created during compilation of the circuit design.

29. The computer system of claim 26, wherein the clock file data comprises at least one selected from a group consisting of a periodic clock, a plurality of periodic clocks, and a plurality of periodic clocks and non-periodic clocks.

30. An apparatus for providing a next clock edge value calculation, comprising:
- means for obtaining a clock file data, wherein the clock file data comprises a clock label, a rise value, a fall value, and a period value;
- means for calculating a next clock edge value using the clock file data,
- wherein calculating the next clock edge value comprises:
  - determining a first delta value and a second delta value using the rise value, the fall value, and the period value, and
  - alternately adding the first delta value and the second delta value to a previous clock edge value; and
- means for generating an output file using the next clock edge value.

31. An apparatus for providing an nth clock edge value calculation, comprising:
- means for obtaining a clock file data and an n value, wherein the clock file data comprises a clock label, a rise value, a fall value, and a period value;
- means for calculating an nth clock edge value using the clock file data and the n value,
- wherein calculating the nth clock edge value comprises:
  - calculating the nth clock edge value using the rise value and the period value, if the n value is even, and
  - calculating the nth clock edge value using the fall value and the period value, if the n value is odd; and
- means for generating an output file using the nth clock edge value.

* * * * *